United States Patent
Yang (10) Patent No.: US 12,063,843 B2
(45) Date of Patent: Aug. 13, 2024

(54) HEAT DISSIPATION FILM, DISPLAY MODULE, AND ELECTRONIC DEVICE

(71) Applicants: Chengdu BOE Optoelectronics Technology Co., Ltd., Sichuan (CN); BOE Technology Group Co., Ltd., Beijing (CN)

(72) Inventor: Peng Yang, Beijing (CN)

(73) Assignees: Chengdu BOE Optoelctronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/797,561

(22) PCT Filed: Oct. 12, 2021

(86) PCT No.: PCT/CN2021/123291
§ 371 (c)(1),
(2) Date: Aug. 4, 2022

(87) PCT Pub. No.: WO2022/105481
PCT Pub. Date: May 27, 2022

(65) Prior Publication Data
US 2023/0354683 A1  Nov. 2, 2023

(30) Foreign Application Priority Data
Nov. 19, 2020  (CN) .......................... 202022694741.8

(51) Int. Cl.
*H10K 59/80* (2023.01)
*H05K 7/20* (2006.01)

(52) U.S. Cl.
CPC ..... *H10K 59/8794* (2023.02); *H05K 7/20963* (2013.01)

(58) Field of Classification Search
None
See application file for complete search history.

(56) References Cited

U.S. PATENT DOCUMENTS

| | | | |
|---|---|---|---|
| 2019/0087630 A1* | 3/2019 | Seo | G06F 1/1684 |
| 2019/0244002 A1* | 8/2019 | Ye | H10K 50/80 |
| 2019/0272407 A1* | 9/2019 | Park | H10K 50/87 |
| 2019/0306986 A1* | 10/2019 | Lee | H05K 1/183 |
| 2020/0057467 A1* | 2/2020 | Kim | G06F 1/1626 |

* cited by examiner

*Primary Examiner* — James Wu
*Assistant Examiner* — Christopher L Augustin
(74) *Attorney, Agent, or Firm* — IPro, PLLC (57) ABSTRACT

Provided is a heat dissipation film, including: an elastic cushion layer, provided with a first fingerprint through-hole; a heat dissipation layer, disposed on a first side surface of the elastic cushion layer, wherein the heat dissipation layer is provided with a second fingerprint through-hole, an orthographic projection of the first fingerprint through-hole on the first side surface being within an orthographic projection of the second fingerprint through-hole on the first side surface; and an isolation layer, disposed on the first side surface of the elastic cushion layer, wherein the isolation layer is provided with a third fingerprint through-hole, the orthographic projection of the first fingerprint through-hole on the first side surface being at least overlapped with an orthographic projection of the third fingerprint through-hole on the first side surface, and a surface, distal from the first side surface, of the isolation layer is non-adhesive.

20 Claims, 4 Drawing Sheets

HEAT DISSIPATION FILM, DISPLAY MODULE, AND ELECTRONIC DEVICE

CROSS-REFERENCE TO RELATED APPLICATION

This application is a U.S. national stage of international application No. PCT/CN2021/123291, field on Oct. 12, 2021, which claims priority to Chinese Patent Application No. 202022694741.8, filed on Nov. 19, 2020 and entitled "HEAT DISSIPATION FILM, DISPLAY MODULE, AND ELECTRONIC DEVICE," the contents of which are herein incorporated by reference in their entireties.

TECHNICAL FIELD

The present disclosure relates to the field of displays, and in particular, relates to a heat dissipation film, a display module, and an electronic device.

BACKGROUND

Screen fingerprint unlocking is applied in more and more electronic devices such as phones and tablet computers.

SUMMARY

Embodiments of the present disclosure provide a heat dissipation film, a display module, and an electronic device.

In one aspect of the embodiments of the present disclosure, the present disclosure provides a heat dissipation film. The heat dissipation film includes:
  an elastic cushion layer, provided with a first fingerprint through-hole:
  a heat dissipation layer, disposed on a first side surface of the elastic cushion layer, wherein the heat dissipation layer is provided with a second fingerprint through-hole, wherein an orthographic projection of the first fingerprint through-hole on the first side surface is within an orthographic projection of the second fingerprint through-hole on the first side surface; and
  an isolation layer, disposed on the first side surface of the elastic cushion layer, wherein the isolation layer is provided with a third fingerprint through-hole, wherein the orthographic projection of the first fingerprint through-hole on the first side surface is at least overlapped with an orthographic projection of the third fingerprint through-hole on the first side surface, and a surface, distal from the first side surface, of the isolation layer is non-adhesive.

In an example embodiment of the present disclosure, the isolation layer includes:
  a first adhesive layer, disposed on the first side surface of the elastic cushion layer; and
  an insulation layer, disposed on a surface, distal from the first side surface, of the first adhesive layer.

In an example embodiment of the present disclosure, the isolation layer further includes:
  a first protection film, disposed on a surface, distal form the first side surface, of the insulation layer.

In an example embodiment of the present disclosure, the insulation layer is a thermoplastic polyester layer or a polyimide layer.

In an example embodiment of the present disclosure, the orthographic projection of the first fingerprint through-hole on the first side surface is coincident with the orthographic projection of the third fingerprint through-hole on the first side surface.

In an example embodiment of the present disclosure, the isolation layer is disposed in the second fingerprint through-hole.

In an example embodiment of the present disclosure, a first gap is defined between an edge of the isolation layer and an inner side wall of the second fingerprint through-hole.

In an example embodiment of the present disclosure, a width of the first gap ranges from 0.2 mm to 0.3 mm.

In an example embodiment of the present disclosure, the elastic cushion layer is provided with two first fingerprint through-holes;
  the isolation layer is provided with two third fingerprint through-holes in one-to-one correspondence to the two first fingerprint through-holes; and
  the heat dissipation layer is provided with one second fingerprint through-hole;
  wherein the orthographic projections of the two first fingerprint through-holes on the first side surface are both within the orthographic projection of the second fingerprint through-hole on the first side surface.

In an example embodiment of the present disclosure, in a direction perpendicular to the first side surface, a thickness of the isolation layer is less than a depth of the second fingerprint through-hole.

In an example embodiment of the present disclosure, a thickness of the isolation layer ranges from 0.01 mm to 0.02 mm.

In another aspect of the embodiments of the present disclosure, the present disclosure provides a display module. The display module includes a display panel and a heat dissipation film that are successively stacked, wherein the heat dissipation film is the heat dissipation film as described above In an example embodiment of the present disclosure, the display module further includes a second adhesive layer disposed between the display panel and the heat dissipation film, wherein the second adhesive layer is provided with a fourth fingerprint through-hole communicated with the first fingerprint through-hole;
  wherein an orthographic projection of the fourth fingerprint through-hole on the first side surface is coincident with the orthographic projection of the first fingerprint through-hole on the first side surface.

In an example embodiment of the present disclosure, the display module further includes:
  a second protection film, disposed on a surface, distal from the first side surface, of the heat dissipation layer, wherein the second protection film is provided with a fifth fingerprint through-hole communicated with the second fingerprint through-hole; and
  an offset filling layer, disposed in the second fingerprint through-hole and the fifth fingerprint through-hole.

In still another aspect of the embodiments of the present disclosure, the present disclosure provides an electronic device. The electronic device includes the display module as described above and a fingerprint module disposed in a second fingerprint through-hole.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying draw

DETAILED DESCRIPTION

The present disclosure will be described in further detail with reference to the enclosed drawings, to clearly present the objects, technical solutions, and advantages of the present disclosure.

A display panel of the electronic device has a heat dissipation film which is provided with a fingerprint through-hole for mounting a fingerprint module. The heat dissipation film includes an elastic cushion layer and a heat dissipation layer that are successively stacked on the display panel, and the fingerprint through-hole in the elastic cushion layer and the fingerprint through-hole in the heat dissipation layer are communicated with each other. The elastic cushion layer achieves a cushioning function to reduce an excursion of the fingerprint module on the display panel when the display panel is pressed. The heat dissipation layer dissipates heat of the display panel to mitigate an adverse effect of temperature on the display panel.

In the related art, a size of the fingerprint through-hole in the elastic cushion layer is less than a size of the fingerprint through-hole in the heat dissipation layer, such that a groove is formed between the elastic cushion layer and the heat cushion layer. The fingerprint module is mounted in the groove disposed between the elastic cushion layer and the heat dissipation layer. In a direction perpendicular to a display surface of the display panel, a pre-reserved mounting gap is defined between the fingerprint through-hole and the elastic cushion layer, such that the fingerprint module is prevented from protruding out of a surface of the heat dissipation layer and forming a fingerprint on a surface of the display panel.

Because the size of the fingerprint through-hole in the elastic cushion layer is less than the size of the fingerprint through-hole in the heat dissipation layer, a part of a surface, facing the fingerprint module, of the elastic cushion layer is not covered by the heat dissipation layer. Moreover, because the elastic cushion layer is adhesive, when an external surface of the display panel is pressed, the display panel deforms and squeezes the elastic cushion layer simultaneously, such that the elastic cushion layer deforms. The part of the elastic cushion layer exposing at the fingerprint through-hole is adhered to the fingerprint module, and the elastic cushion layer restores from the deformation upon release of pressing, such that the part of the elastic cushion layer exposing at the fingerprint through-hole is not adhered to the fingerprint module, and thus the electronic device produces sound.

Figure 1:
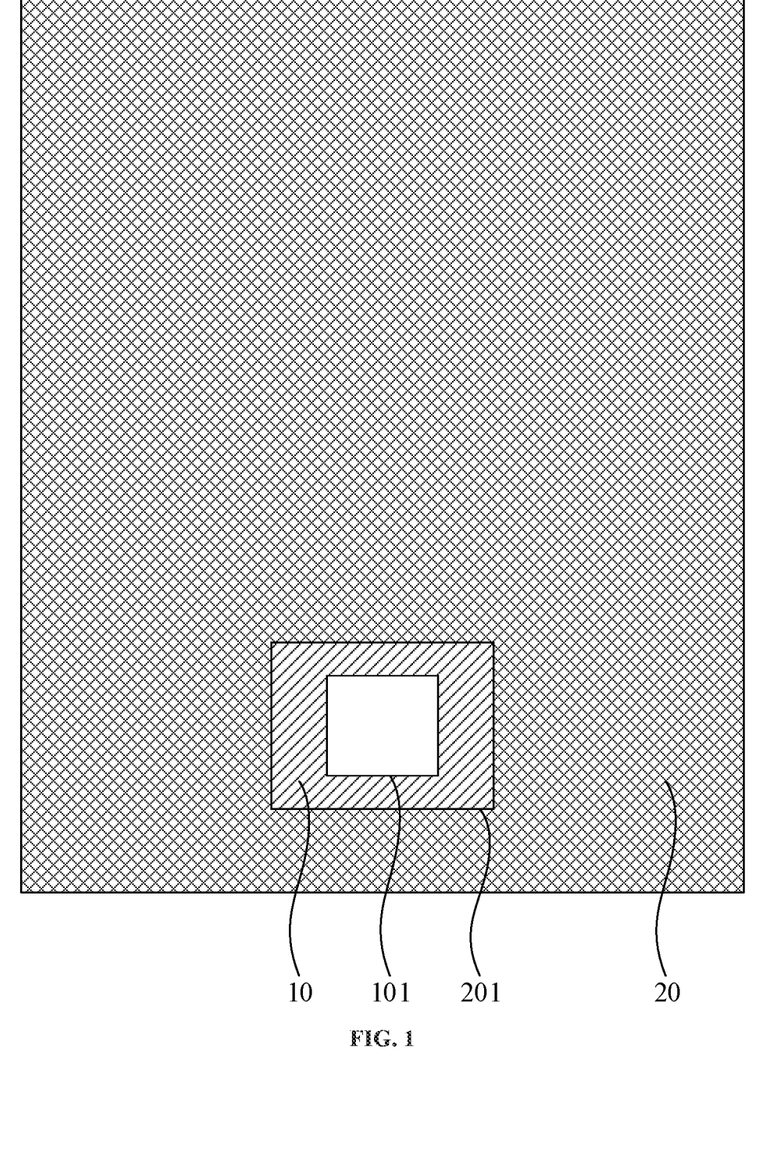
- FIG. 1 is top view of a heat dissipation film without attaching to an isolation layer according to an embodiment of the present disclosure.

FIG. 1 is top view of a heat dissipation film without attaching to an isolation layer according to an embodiment of the present disclosure. Referring to FIG. 1, the heat dissipation film 100 includes an elastic cushion layer 10 and a heat dissipation layer 20 that are successively stacked. The elastic cushion layer 10 is provided with a first fingerprint through-hole 101, and the heat dissipation layer 20 is provided with a second fingerprint through-hole 201, wherein the first fingerprint through-hole 101 is communicated with the second fingerprint through-hole 201.

Figure 2:
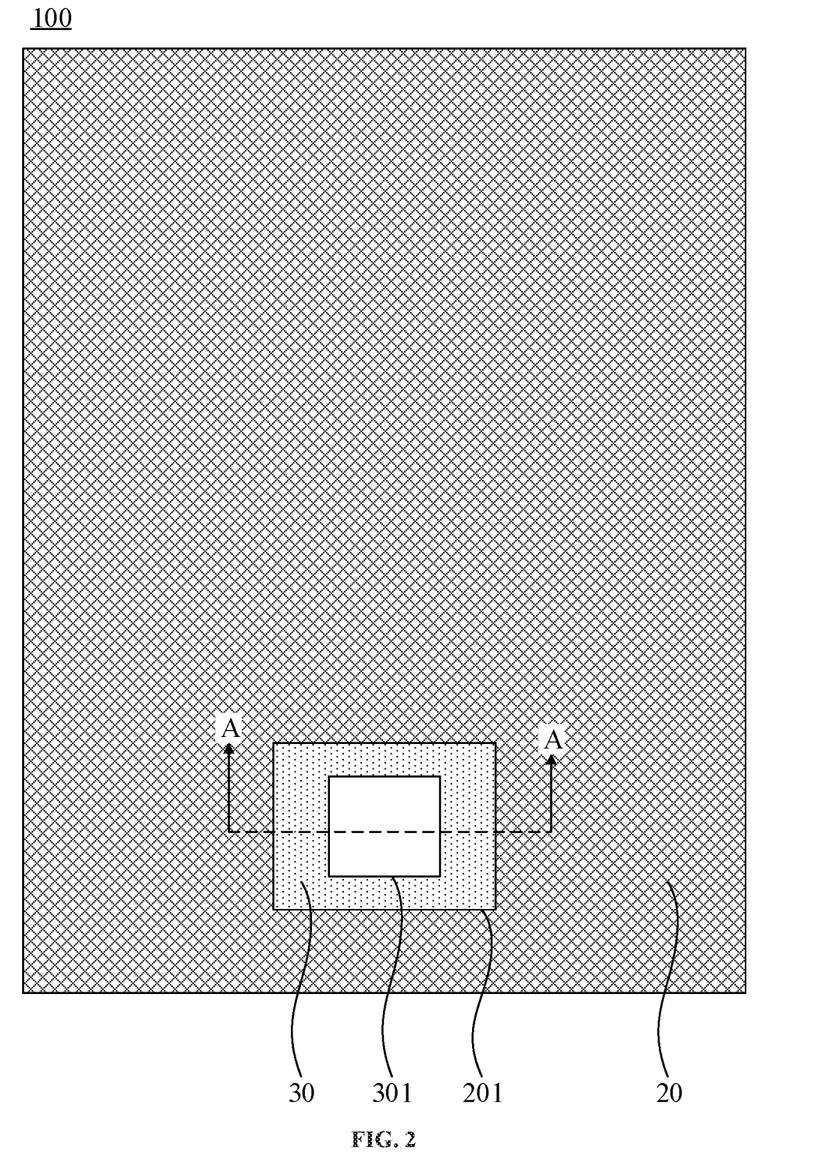
FIG. 2 is a top view of a heat dissipation film according to an embodiment of the present disclosure.

FIG. 2 is a top view of a heat dissipation film according to an embodiment of the present disclosure. Referring to FIG. 2, the heat dissipation film according to the embodiments of the present disclosure further includes an isolation layer 30. The isolation layer 30 is provided with a third fingerprint through-hole 301.

Figure 3:
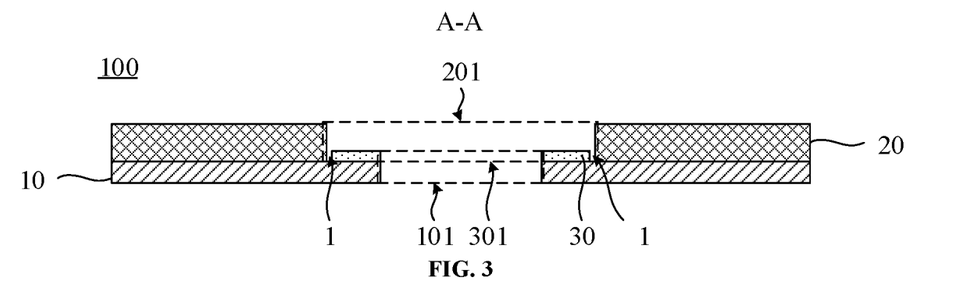
FIG. 3 is a section along an A-A plane in FIG. 2.

FIG. 3 is a section along an A-A plane in FIG. 2. Referring to FIG. 3, the heat dissipation layer 20 is disposed on a first side surface 11 of the elastic cushion layer 10. An orthographic projection of the first fingerprint through-hole 101 on the first side surface is disposed in an orthographic projection of the second fingerprint through-hole 201 on the first side surface 11. The orthographic projection of the first fingerprint through-hole 101 on the first side surface is at least overlapped with an orthographic projection of the third fingerprint through-hole 301 on the first side surface. A surface, distal from the first side surface 11, of the isolation layer 30 is non-adhesive.

In the embodiments of the present disclosure, when the heat dissipation film is disposed in an electronic device, the fingerprint module is disposed in a groove disposed between the elastic cushion layer and the heat dissipation layer. The isolation layer is disposed on the first side surface of the elastic cushion layer and covers an exposing part of the elastic cushion layer, that is, the isolation layer is disposed between the fingerprint module and the elastic cushion layer; and a surface, facing the fingerprint module, of the isolation layer is non-adhesive. Therefore, when a screen of the display panel is pressed, even if the display panel deforms to drive the elastic cushion layer and the isolation layer to deform so that the isolation layer is in contact with the fingerprint module, the isolation layer is not adhered to the fingerprint module. When the isolation layer restores from the deformation, the electronic device does not produce sound.

In the embodiments of the present disclosure, the elastic cushion layer 10 is a foam. The foam is elastic, and thus an extrusion of the fingerprint module on the display panel when the display panel is pressed may be reduced.

In an example embodiment of the present disclosure, the orthographic projection of the first fingerprint through-hole 101 on the first side surface 11 is coincident with the orthographic projection of the third fingerprint through-hole 301 on the first side surface 11.

In a process of fingerprint identification, light enters the fingerprint module via the first fingerprint through-hole 101, the third fingerprint through-hole 301, and the second fingerprint through-hole 201, such that fingerprints are identified. Because a boundary of the third fingerprint through-hole 301 completely corresponds to a boundary of the first fingerprint through-hole 101, the fingerprint identification is prevented from being affected by the isolation layer 30.

In the embodiments of the present disclosure, to ensure perforating progresses of the first fingerprint through-hole 101 and the third fingerprint through-hole 301, the first fingerprint through-hole 101 and the third fingerprint through-hole 301 may be manufactured simultaneously in a manufacturing process. For example, the isolation layer 30 is attached to the first side surface 11 first, and then a punching is completed at one time by using a cutting die. At the same time, the first fingerprint through-hole 101 is formed on the elastic cushion layer 10, and the third fingerprint through-hole 301 is formed on the isolation layer 30, such that an external boundary of the first fingerprint through-hole 101 is completely consistent with an external boundary of the third fingerprint through-hole 301. Moreover, the manufacture process may be simplified by manufacturing the first fingerprint through-hole 101 and the third fingerprint through-hole 301 at one time.

In an example embodiment of the present disclosure, the isolation layer 30 is disposed in the second fingerprint through-hole 201. In this way, a part of the isolation layer is prevented from protruding out of a surface of the heat dissipation layer 20, such that the surface of the heat dissipation layer 20 is even, and thus uneven marks are prevented from being formed on the display panel.

Referring to FIG. 3 again, a first gap 1 is defined between an edge of the isolation layer 30 and an inner wall of the second fingerprint through-hole 201. That is, a size of the isolation layer 30 is less than a size of the second fingerprint through-hole 201, and a mounting gap is pre-reserved to facilitate mounting of the isolation layer 30.

In an example embodiment of the present disclosure, a width of the first gap 1 ranges from 0.2 mm to 0.3 mm.

On the hand, a size of the first gap 1 is ensured to facilitate the mounting; and on the other hand, the size of the first gap 1 is prevented from being too large, otherwise the size of the isolation layer 30 is too small to effectively isolate the elastic cushion layer 10 and the fingerprint module.

Figure 4:
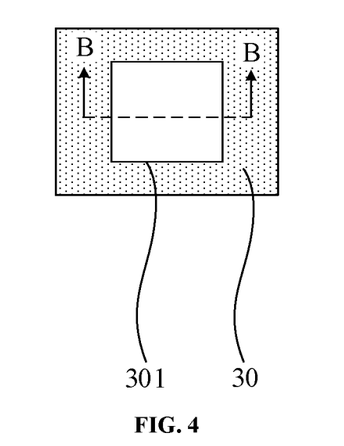
FIG. 4 is a top view of an isolation layer according to an embodiment of the present disclosure.

FIG. 4 is a top view of an isolation layer according to an embodiment of the present disclosure. The heat dissipation film shown in FIG. 2 is formed by attaching the isolation layer 30 to the second fingerprint through-hole 201 shown in FIG. 1.

Figure 5:
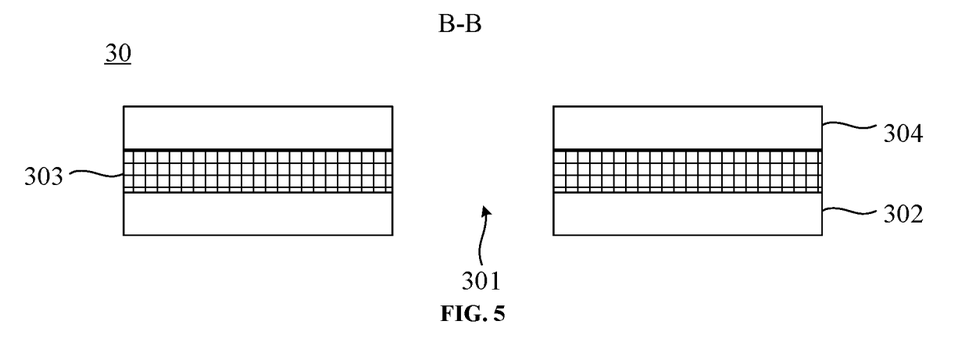
FIG. 5 is a section along a B-B plane in FIG. 4.

FIG. 5 is a section along a B-B plane in FIG. 4. Referring to FIG. 5, the isolation layer 30 includes a first adhesive layer 302 and an insulation layer 303. The first adhesive layer 302 is disposed on the first side surface 11 of the elastic cushion layer 10. The insulation layer 303 is disposed on a surface, distal from the first side surface 11, of the first adhesive layer 302.

The first adhesive layer 302 adheres the insulation layer 303 to the first side surface 11, such that the isolation layer 30 may be attached to the elastic cushion layer 10. The insulation layer 303 separates the fingerprint module from the elastic cushion layer 10, such that characteristics of the fingerprint module is prevented from being affected, and the fingerprint module is prevented from being adhered to the elastic cushion layer 10 at the same time.

In an example embodiment of the present disclosure, the first adhesive layer 302 may be a viscose layer.

Exemplarily, the first adhesive layer 302 is an EMBO layer.

Referring to FIG. 5 again, the isolation layer 30 further includes a first protection film 304. The first protection film 304 is disposed on a surface, distal form the first side surface 11, of the insulation layer 303.

The first protection film 304 is disposed on the insulation layer 303 to separate the fingerprint module form the insulation layer 303. When the fingerprint module squeezes the insulation layer 303, the first protection film 304 protects the insulation layer 303, and thus the insulation layer 303 is prevented from being damaged.

In the embodiments of the present disclosure, prior to attaching the isolation layer 30 to the elastic cushion layer 10, a surface, distal form the insulation layer 303, of the first adhesive layer 302 of the isolation layer 300 is provided with a protection film. The protection layer protects the first adhesive layer 302 to prevent impurities such as dust from being absorbed on the first adhesive layer 302, and thus a viscosity of the first adhesive layer 302 is not affected. When the isolation layer 30 is attached, the isolation layer 30 is cut into a suitable shape first, then the protection film attached to the first adhesive layer 302 is torn off, and the isolation layer 30 is attached to an exposing part of the elastic cushion layer 10.

In an example embodiment of the present disclosure, the insulation layer 303 is a thermoplastic polyester layer or a polyimide (PI) layer. For example, the insulation layer is a polyethylene terephthalate (PET) layer.

In the embodiments of the present disclosure, the first protection film 304 may be a thermoplastic polyester thin film, such as a PET thin film.

In the embodiments of the present disclosure, the isolation layer 30 a film layer with an adhesive single surface, which may be referred to as a sing-sided release film.

In the embodiments of the present disclosure, a thickness of the heat dissipation layer 20 ranges from 0.03 mm to 0.05 mm. That is, in a direction perpendicular to the first side surface 11, a depth of the second fingerprint through-hole 201 ranges from 0.03 mm to 0.05 mm.

Exemplarily, the thickness of the heat dissipation layer 20 is 0.03 mm.

In the embodiments of the present disclosure, the heat dissipation layer 20 is copper foil which has a good heat dissipation effect, such that heat of the display panel is dispersed, and thus the display panel is prevented from being damaged by over-high temperature. Besides, the copper foil has a soaking function. When the display panel is partially overheated, the heat may be dispersed to prevent the display panel from being damaged by over-high partial temperature. Further, the copper foil is conducive, which may lead out static electricity in the display panel, and thus a transmission of electric signals is prevented from being affected by the static electricity, In other example embodiments of the present disclosure, the heat dissipation layer 20 may be made of other materials with heat dissipation and conductivity, which is not limited herein.

In the embodiments of the present disclosure, a thickness of the isolation layer 30 ranges from 0.01 mm to 0.02 mm, and the thickness of the isolation layer 30 is less than the depth of the second fingerprint through-hole 201, such that the isolation layer 30 may be mounted in the second fingerprint through-hole 201, and space for mounting the fingerprint module is pre-served in the second fingerprint through-hole 201.

Exemplarily, the thickness of the isolation layer 30 is 0.02 mm.

In the embodiments of the present disclosure, a thickness of the elastic cushion layer 10 ranges from 0.1 mm to 0.2 mm.

In the embodiments of the present disclosure, two first fingerprint through-holes 101 are disposed in the elastic cushion layer 10.

In the embodiments of the present disclosure, the isolation layer 30 is disposed in the second fingerprint through-hole 201, and a boundary shape of the isolation layer 30 is consistent with a boundary shape of the second fingerprint through-hole 201. The isolation layer 30 may be cut according to the boundary shape of the second fingerprint through-hole 201, such that the shape of the isolation layer 30 may be matched with the boundary of the second fingerprint through-hole 201.

Figure 6:
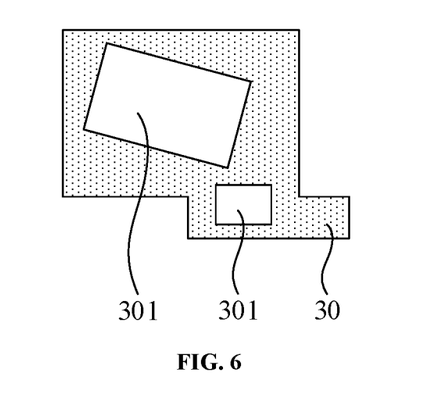
FIG. 6 is a top view of another isolation layer according to an embodiment of the present disclosure.

FIG. 6 is a top view of another isolation layer according to an embodiment of the present disclosure. Referring to FIG. 6, the isolation layer 30 is provided with two third fingerprint through-holes 301. The two third fingerprint through-holes 301 are in one-to-one correspondence to the two first fingerprint through-holes 101.

Two fingerprint through-holes are disposed both in the elastic cushion layer 10 and the isolation layer 30, and the two fingerprint through-holes are provided for mounting of the fingerprint modules. The two fingerprint modules are configured to identify the fingerprints, thereby ensuring an accuracy of the fingerprint identification.

In the embodiments of the present disclosure, the heat dissipation layer 20 is provided with a second fingerprint through-hole 201. The orthographic projections of the two first fingerprint through-holes 101 on the first side surface 11 are within the orthographic projection of the second fingerprint through-hole 201 on the first side surface 11.

The second fingerprint through-hole 201 in the heat dissipation layer 20 is communicated with the two first fingerprint through-holes 101. The second fingerprint through-hole 201 may be manufactured larger, thereby easing the manufacture process.

In other example embodiments of the present disclosure, the number of third fingerprint through-holes 301 in the isolation layer 30 may be other values according to the number of fingerprint modules in the electronic device, which is not limited herein.

Referring to FIG. 6, the shape of the isolation layer 30 is irregular. In other example embodiments of the present disclosure, the shape of the isolation layer 30 may be adjusted by the boundary shape of the second fingerprint through-hole 201.

Figure 7:
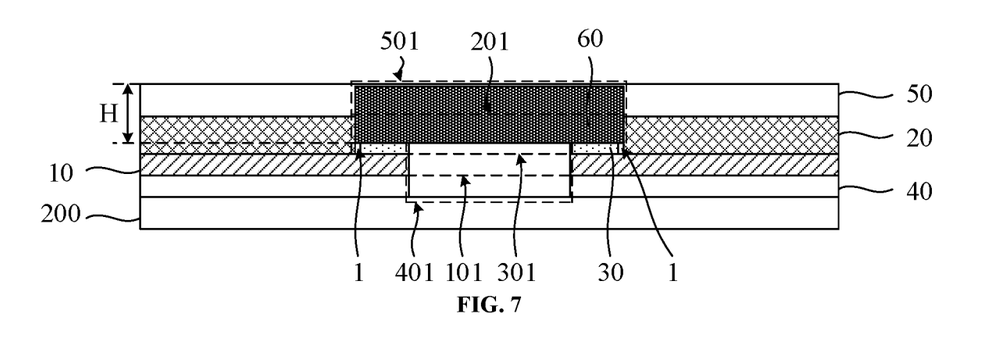
FIG. 7 is a section schematic diagram of a display module according to an embodiment of the present disclosure.

FIG. 7 is a section schematic diagram of a display module according to an embodiment of the present disclosure. Referring to FIG. 7, the display module includes a display panel 200 and a heat dissipation film 100 that are successively stacked.

In the embodiments of the present disclosure, when the display module is disposed in an electronic device, a fingerprint module is disposed in a groove disposed between an elastic cushion layer and a heat dissipation layer. An isolation layer is disposed on a first side surface of the elastic cushion layer and covers an exposing part of the elastic cushion layer, that is, the isolation layer is disposed between the fingerprint module and the elastic cushion layer; and a surface, facing the fingerprint module, of the isolation layer is non-adhesive. Therefore, when a screen of the display panel is pressed, even in a case that the display panel deforms to drive the elastic cushion layer and the isolation layer to deform so that the isolation layer is in contact with the fingerprint module, the isolation layer is not adhered to the fingerprint module. When the isolation layer restores from the deformation, the electronic device does not produce sound.

Referring to FIG. 7, the display module further includes a second adhesive layer 40 disposed between the display panel 200 and the dissipation film 100. A fourth fingerprint through-hole 401 communicated with a first fingerprint through-hole 101 is disposed in the second adhesive layer 40.

It is more convenient to assemble the display panel 200 and the heat dissipation film 100 by the second adhesive layer 40. At the same time, by disposing the fourth fingerprint through-hole 401, the second adhesive layer 40 is prevented from affecting light transmission, and thus the fingerprint identification is not affected.

In the embodiments of the present disclosure, an orthographic projection of the fourth fingerprint through-hole 401 on the first side surface 11 is coincident with an orthographic projection of the first fingerprint through-hole 101 on the first side surface 11.

In a process of fingerprint identification, light enters the fingerprint module via the fourth fingerprint through-hole 401, the first fingerprint through-hole 101, a third fingerprint through-hole 301, and a second fingerprint through-hole 201, such that fingerprints are identified. Because a boundary of the fourth fingerprint 401 completely corresponds to a boundary of the first fingerprint through-hole 101, the fingerprint identification is prevented from being affected by the second adhesive layer 40.

In the embodiments of the present disclosure, to ensure perforating progresses of the first fingerprint through-hole 101 and the fourth fingerprint through-hole 401, the first fingerprint through-hole 101, the third fingerprint through-hole 301, and the fourth fingerprint through-hole 401 may be manufactured simultaneously in a manufacturing process. For example, the isolation layer 30 is attached to the first side surface 11 first, then the heat dissipation film 100 is attached to the display panel 200 by the second adhesive layer 40, and then a punching is completed at one time by using a cutting die. At the same time, the fourth fingerprint through-hole 401 is formed on the second adhesive layer 40, the first fingerprint through-hole 101 is formed on the elastic cushion layer 10, and the third fingerprint through-hole 301 is formed on the isolation layer 30, such that sizes of the fourth fingerprint through-hole 401, the first fingerprint through-hole 101, and the third fingerprint through-hole 301 are consistent. Moreover, the manufacture process may be simplified by manufacturing the fourth fingerprint through-hole 401, the first fingerprint through-hole 101 and the third fingerprint through-hole 301 at one time.

Referring to FIG. 7 again, the display module further includes a second protection film 50 and an offset filling layer 60. The second protection film 50 is disposed on a surface, distal form the first side surface 11, of the heat dissipation layer 20, and provided with a fifth fingerprint through-hole 501 communicated with the second fingerprint through-hole 201. The offset filling through-hole 60 is disposed in the second fingerprint through-hole 201 and the fifth fingerprint through-hole 501.

In the embodiments of the present disclosure, the second protection film 50 is attached to the heat dissipation layer 20 to protect the heat dissipation layer 20. Therefore, the second fingerprint through-hole 201 and the fifth fingerprint through-hole 501 are manufactured simultaneously. The second protection film 50 and the offset filling layer 60 are intermediate film layers when the display module is manufactured, and thus it is convenient to attach the heat dissipation film 100 to the display panel 200.

Exemplarily, prior to attaching the heat dissipation film 100 to the display panel 200, it is necessary to use a roller to press the heat dissipation film 100 on a surface of the second protection film 50, such that the heat dissipation film 100 may be firmly attached to the display panel 200. Because in this case, the heat dissipation layer 100 is provided with fingerprint through-holes, and an offset H is present between the isolation layer 30 and the second protection film 50, the pressure borne by the heat dissipation film 100 may be uneven in a case that the roller directly presses the heat dissipation film 100, and thus the heat dissipation film 200 may be damaged at the fingerprint through-holes. The offset filling layer 60 is provided to fill the offset disposed between the isolation layer 30 and the second protection film 50. When the roller is rolled, the entire heat dissipation film 100 is evenly-stressed, and the heat dissipation film 100 is attached to the display panel 200.

In the embodiments of the present disclosure, the second protection film 50 is a thermoplastic polyester thin film, such as a PET thin film.

In the embodiments of the present disclosure, a thickness of the second protection film 50 ranges from 0.05 mm to 0.15 mm. A thickness of the offset filling layer 60 ranges from 0.07 mm to 0.1 mm.

The thickness of the heat dissipation layer 20 ranges from 0.03 mm to 0.05 m, the thickness of the isolation layer 30 ranges from 0.01 mm to 0.02 mm, and a distance between the isolation layer 30 and the offset filling layer 60 is equal to a sum of the thickness of the heat dissipation layer 20 and the thickness of the second protection film 50 minus the thickness of the isolation layer 30. Therefore, in the embodiments of the present disclosure, the thickness of the offset filling layer 60 should be less than the sum of the thickness of the heat dissipation layer 20 and the thickness of the second protection film 50 minus the thickness of the isolation layer 30. In this way, the offset filling layer 60 is prevented from protruding out of the surface of the second protection layer 50, such that the press of the roller is facilitated. In other example embodiments of the present disclosure, the thickness of the offset filling layer 60 may be equal to the sum of the thickness of the heat dissipation layer 20 and the thickness of the second protection film 50 minus the thickness of the isolation layer 30.

Exemplarily, the thickness of the heat dissipation layer 20 is 0.03 mm, the thickness of the second protection film 50 is 0.1 mm, the thickness of the isolation layer 30 is 0.02 mm, and the thickness of the offset filling layer 60 is 0.09 mm.

In the embodiments of the present disclosure, when the heat dissipation film 100 is attached to the display panel 200, the second protection film 50 and the offset filling layer 60 are torn off, and then the fingerprint module is mounted.

In the embodiments of the present disclosure, the offset filling layer 60 may be a thermoplastic polyester thin film, such as a PET thin film.

The display panel 200 according to the embodiments of the present disclosure is an organic light-emitting diode (OLED) display panel.

Figure 8:
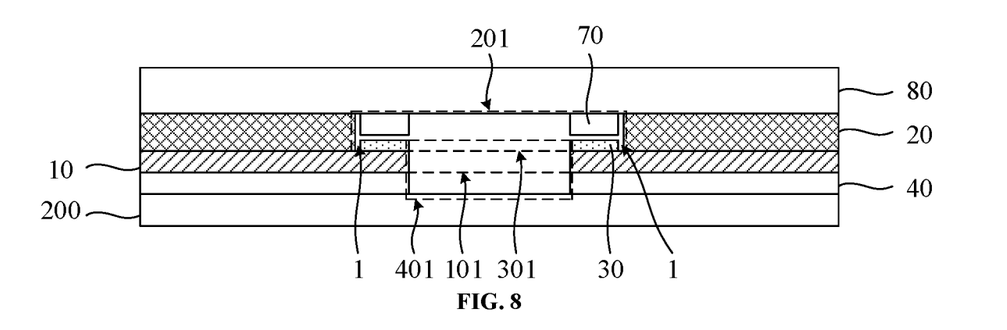
FIG. 8 is a section schematic diagram of an electronic device according to an embodiment of the present disclosure.

FIG. 8 is a section schematic diagram of an electronic device according to an embodiment of the present disclosure. Referring to FIG. 8, the electronic device includes a display module and a fingerprint module 70 disposed in the second fingerprint through-hole 201.

In the electronic device according to the embodiments of the present disclosure, the fingerprint module is disposed in a groove disposed between an elastic cushion layer and a heat dissipation layer. An isolation layer is disposed on a first side surface of the elastic cushion layer and covers an exposing part of the elastic cushion layer, that is, the isolation layer is disposed between the fingerprint module and the elastic cushion layer; and a surface, facing the fingerprint module, of the isolation layer is non-adhesive. Therefore, when a screen of a display panel is pressed, even in a case that the display panel deforms to drive the elastic cushion layer and the isolation layer to deform so that the isolation layer is in contact with the fingerprint module, the isolation layer is not adhered to the fingerprint module. When the isolation layer restores from the deformation, the electronic device does not produce sound.

Referring to FIG. 8 again, the electronic device further includes an electronic device middle frame 80 disposed on the fingerprint module 70. The fingerprint module 70 is fixed on the electronic device middle frame 80 to ensure that the fingerprint module 70 is stable.

Exemplarily, the electronic device may be any electronic device with fingerprint identification and display functions, such as a smart phone and a tablet computer.

Described above are merely optional embodiments of the present disclosure, and are not intended to limit the present disclosure. An modifications, equivalent substitutions, improvements, and the like may be made within the protection scope of the present disclosure, without departing from the spirit and principles of the present disclosure.

What is claimed is:

1. A heat dissipation film, comprising:
   an elastic cushion layer, provided with a first fingerprint through-hole;
   a heat dissipation layer, disposed on a first side surface of the elastic cushion layer, wherein the heat dissipation layer is provided with a second fingerprint through-hole, an orthographic projection of the first fingerprint through-hole on the first side surface being within an orthographic projection of the second fingerprint through-hole on the first side surface; and
   an isolation layer, disposed on the first side surface of the elastic cushion layer, wherein the isolation layer is provided with a third fingerprint through-hole, the orthographic projection of the first fingerprint through-hole on the first side surface being at least overlapped with an orthographic projection of the third fingerprint through-hole on the first side surface, and a surface, distal from the first side surface, of the isolation layer is non-adhesive.

2. The heat dissipation film according to claim 1, wherein the isolation layer comprises:
   a first adhesive layer, disposed on the first side surface of the elastic cushion layer; and
   an insulation layer, disposed on a surface, distal from the first side surface, of the first adhesive layer.

3. The heat dissipation layer according to claim 2, wherein the isolation layer further comprises:
   a first protection film, disposed on a surface, distal form the first side surface, of the insulation layer.

4. The heat dissipation film according to claim 2, wherein the insulation layer is a thermoplastic polyester layer or a polyimide layer.

5. The heat dissipation film according to claim 1, wherein the orthographic projection of the first fingerprint through-hole on the first side surface is coincident with the orthographic projection of the third fingerprint through-hole on the first side surface.

6. The heat dissipation film according to claim 5, wherein the isolation layer is disposed in the second fingerprint through-hole.

7. The heat dissipation film according to claim 6, wherein a first gap is defined between an edge of the isolation layer and an inner side wall of the second fingerprint through-hole.

8. The heat dissipation film according to claim 7, wherein a width of the first gap ranges from 0.2 mm to 0.3 mm.

9. The heat dissipation film according to claim 1, wherein the elastic cushion layer is provided with two first fingerprint through-holes;

the isolation layer is provided with two third fingerprint through-holes in one-to-one correspondence to the two first fingerprint through-holes; and the heat dissipation layer is provided with one second fingerprint through-hole;

wherein the orthographic projections of the two first fingerprint through-holes on the first side surface are both within the orthographic projection of the second fingerprint through-hole on the first side surface.

10. The heat dissipation film according to claim 1, wherein in a direction perpendicular to the first side surface, a thickness of the isolation layer is less than a depth of the second fingerprint through-hole.

11. The heat dissipation film according to claim 1, wherein a thickness of the isolation layer ranges from 0.01 mm to 0.02 mm.

12. A display module, comprising: a display panel and a heat dissipation film that are successively stacked, wherein the heat dissipation film comprises:
- an elastic cushion layer, provided with a first fingerprint through-hole;
- a heat dissipation layer, disposed on a first side surface of the elastic cushion layer, wherein the heat dissipation layer is provided with a second fingerprint through-hole, wherein an orthographic projection of the first fingerprint through-hole on the first side surface is within an orthographic projection of the second fingerprint through-hole on the first side surface; and
- an isolation layer, disposed on the first side surface of the elastic cushion layer, wherein the isolation layer is provided with a third fingerprint through-hole, wherein the orthographic projection of the first fingerprint through-hole on the first side surface is at least overlapped with an orthographic projection of the third fingerprint through-hole on the first side surface, and a surface, distal from the first side surface, of the isolation layer is non-adhesive.

13. The display module according to claim 12, further comprising: a second adhesive layer disposed between the display panel and the heat dissipation film, wherein the second adhesive layer is provided with a fourth fingerprint through-hole communicated with the first fingerprint through-hole;

wherein an orthographic projection of the fourth fingerprint through-hole on the first side surface is coincident with the orthographic projection of the first fingerprint through-hole on the first side surface.

14. The display module according to claim 12, further comprising:
- a second protection film, disposed on a surface, distal from the first side surface, of the heat dissipation layer, wherein the second protection film is provided with a fifth fingerprint through-hole communicated with the second fingerprint through-hole; and
- an offset filling layer, disposed in both the second fingerprint through-hole and the fifth fingerprint through-hole.

15. The display module according to claim 12, wherein the isolation layer comprises:
- a first adhesive layer, disposed on the first side surface of the elastic cushion layer; and
- an insulation layer, disposed on a surface, distal from the first side surface, of the first adhesive layer.

16. The display module according to claim 15, wherein the isolation layer further comprises:
- a first protection film, disposed on a surface, distal form the first side surface, of the insulation layer.

17. The display module according to claim 15, wherein the insulation layer is a thermoplastic polyester layer or a polyimide layer.

18. The display module according to claim 12, wherein the orthographic projection of the first fingerprint through-hole on the first side surface is coincident with the orthographic projection of the third fingerprint through-hole on the first side surface.

19. The display module according to claim 18, wherein the isolation layer is disposed in the second fingerprint through-hole.

20. An electronic device, comprising: a display module and a fingerprint module disposed in a second fingerprint through-hole;

wherein the display module comprises: a display panel and a heat dissipation film that are successively stacked, wherein the heat dissipation film comprises:
- an elastic cushion layer, provided with a first fingerprint through-hole;
- a heat dissipation layer, disposed on a first side surface of the elastic cushion layer, wherein the heat dissipation layer is provided with the second fingerprint through-hole, wherein an orthographic projection of the first fingerprint through-hole on the first side surface is within an orthographic projection of the second fingerprint through-hole on the first side surface; and
- an isolation layer, disposed on the first side surface of the elastic cushion layer, wherein the isolation layer is provided with a third fingerprint through-hole, wherein the orthographic projection of the first fingerprint through-hole on the first side surface is at least overlapped with an orthographic projection of the third fingerprint through-hole on the first side surface, and a surface, distal from the first side surface, of the isolation layer is non-adhesive.

* * * * *

UNITED STATES PATENT AND TRADEMARK OFFICE
CERTIFICATE OF CORRECTION

PATENT NO. : 12,063,843 B2
APPLICATION NO. : 17/797561
DATED : August 13, 2024
INVENTOR(S) : Peng Yang Page 1 of 1

It is certified that error appears in the above-identified patent and that said Letters Patent is hereby corrected as shown below:

On the Title Page

Item (73) should read:
(73) Assignees: Chengdu BOE Optoelectronics Technology Co., Ltd., Chengdu, Sichuan (CN); BOE Technology Group Co., Ltd., Beijing (CN)

Signed and Sealed this
Twenty-ninth Day of July, 2025

Coke Morgan Stewart
*Acting Director of the United States Patent and Trademark Office*